United States Patent [19]

Singer et al.

[11] Patent Number: 5,813,752
[45] Date of Patent: Sep. 29, 1998

[54] UV/BLUE LED-PHOSPHOR DEVICE WITH SHORT WAVE PASS, LONG WAVE PASS BAND PASS AND PEROIT FILTERS

[75] Inventors: Barry Singer, New York, N.Y.; Cornelis R. Ronda, Aachen, Germany; Leendert Vriens, BA Eindhoven, Netherlands

[73] Assignee: Philips Electronics North America Corporation, New York, N.Y.

[21] Appl. No.: 863,989

[22] Filed: May 27, 1997

[51] Int. Cl.⁶ .................................................. H04N 9/31
[52] U.S. Cl. .................... 362/293; 313/112; 313/113; 313/114; 313/502; 313/506; 313/512; 362/800; 362/293; 362/260; 257/98; 257/97; 257/13
[58] Field of Search .................... 313/112, 113, 313/114, 502, 506, 512; 362/800, 293, 260; 257/13, 97, 98

[56] References Cited

U.S. PATENT DOCUMENTS

| | | | |
|---|---|---|---|
| 4,822,144 | 4/1989 | Vriens | 350/339 F |
| 4,882,617 | 11/1989 | Vriens | 358/60 |
| 5,557,115 | 9/1996 | Shakuda | 257/81 |

FOREIGN PATENT DOCUMENTS

| | | | |
|---|---|---|---|
| 0581232A1 | 2/1994 | European Pat. Off. | H05B 33/12 |
| 0712148 | 5/1996 | European Pat. Off. | H01J 17/49 |
| 5152609 | 6/1993 | Japan | H01L 33/00 |

OTHER PUBLICATIONS

"Interference filters in projection television tubes", L. Vriens, J.A. Clarke et al, Philips Technical Review, vol. 44, No. 7, Mar. 1989, pp. 201–210.

*Primary Examiner*—Sandra L. O'Shea
*Assistant Examiner*—Matthew J. Gerike
*Attorney, Agent, or Firm*—John C. Fox

[57] ABSTRACT

A visible light emitting device for use in lighting and/or display applications includes a UV LED, a phosphor layer on the upper, main light emitting surface of the LED, and a short wave pass (SWP) filter between the LED and the phosphor layer to transmit UV light from the LED to the phosphor layer, as well as to reflect visible light from the phosphor layer in a forward direction, thus enhancing the efficiency of the device. Additional optical filters located on the top of the phosphor layer further enhance efficiency and/or spectral characteristics of the emitted light.

12 Claims, 4 Drawing Sheets

UV/BLUE LED-PHOSPHOR DEVICE WITH SHORT WAVE PASS, LONG WAVE PASS BAND PASS AND PEROIT FILTERS

CROSS REFERENCE TO RELATED APPLICATIONS

Copending United States patent application Ser. No. 08/863,987, (Attorney Docket No. PHA 23,249), filed concurrently herewith, relates to efficient cavity-based UV/Blue LED/phosphor light emitting devices.

BACKGROUND OF THE INVENTION

This invention relates to light emitting devices comprising a UV/blue light emitting diode (LED) and a UV/blue-excitable, visible light emitting phosphor. Such light emitting devices are disclosed in Japanese Kokai No. 5-152609, and U.S. patent application Ser. No. 08/661,520 (Attorney Docket No. PHA 23,132) filed Jun. 11, 1996.

The advent of UV and blue light emitting diodes (LEDs) of GaN-based epitaxial structures, for the first time allowed the possibility to generate white light from an LED by applying luminescent phosphor materials on top of the LED, which materials partially transform the UV or blue light into longer wavelength, e.g. yellow light, as in the case of the blue-absorbing and yellow-emitting $Y_3Al_5O_{12}:Ce$ phosphor, as described by Nichia Chemical Company.

As used herein, the term "UV/blue LED" means an LED emitting in the UV range, or in the blue range, or in both the UV and blue ranges of the electromagnetic spectrum.

Successful implementation of such a device is of course dependent upon the efficient conversion of UV/blue light into visible light of the desired wavelength and the subsequent efficient extraction of the generated visible light from the device.

However, in such devices, the phosphors only partially absorb the light from the LED. The unabsorbed light is partially reflected by the phosphor particles back in the direction of the LED, and partially transmitted through the phosphor layer, in both cases reducing the visible light output.

In addition, visible light emitted by the phosphor may never leave the device, due to internal reflection and/or absorption at various locations within the device structure.

OBJECTS AND SUMMARY OF THE INVENTION

Accordingly, it is an object of the invention to enhance this efficient conversion and extraction of light from a UV/blue LED-phosphor device.

It is another object of the invention to modify the spectral distribution of the emitted light from such a device.

It is another object of the invention to affect the angular emission of the visible light emitted from such a device.

In accordance with one aspect of the invention, a UV/blue LED/phosphor light emitting device for use in lighting and/or display applications including a GaN-based LED and a phosphor layer on the upper (main light-emitting) surface of the LED, is characterized in that a dielectric mirror is located on the upper surface of the LED, between the LED and the phosphor layer, which mirror transmits the light from the LED which is intended to excite the phosphor material, and reflects the light generated by the phosphor material. Such a mirror is referred to herein as a short wavepass filter (SWP).

Such reflected light can then pass through the phosphor layer (either directly or via scattering by the phosphor grains) to contribute significantly to the total light output of the device.

In another aspect of the invention, one or more additional dielectric mirrors are placed on top of the phosphor layer.

In accordance with one embodiment, a SWP filter is located on the upper surface (viewing side) of the phosphor layer, resulting in a higher light output in the forward direction, as well as the removal of an undesired portion, for example, a long wavelength tail, of the emission spectrum of the phosphor.

In accordance with another embodiment, a long wave pass (LWP) filter is placed on upper surface of the phosphor layer, resulting in reflection of the short wavelength light from the LED for exciting the phosphor, thus increasing the absorption of such short wavelength light by the phosphor, and consequently increasing the emission of longer wavelength light from the phosphor. In addition, such a SWP filter prevents potentially harmful UV light from leaving the device.

In order to obtain maximum advantage from the SWP filter on the viewing side of the phosphor layer, the cut off wavelength of the filter has to be matched to the emission spectrum of the phosphor, while the cut off wavelength of the LWP filter has to be adapted to the emission spectrum of the LED.

In accordance with yet another embodiment, a band pass (BP) filter is placed on top of the phosphor layer, such BP filter having a passband which matches the short and long wavelength cut offs of the individual SWP and the LWP filters, thus combining the advantages of the SWP and the LWP filters in a single device.

Such light emitting devices are useful in both lighting and display applications. A full color display may be obtained, for example, by using a two dimensional array of such devices emitting either white light or colored light. An associated array of color filters may be used to convert white light to colored light, or to enhance the color purity of colored light.

BRIEF DESCRIPTION OF THE DRAWING

The invention will be explained and illustrated in terms of a number of embodiments, with the help of the drawings, in which.

DESCRIPTION OF THE PREFERRED EMBODIMENTS

Figure 1:
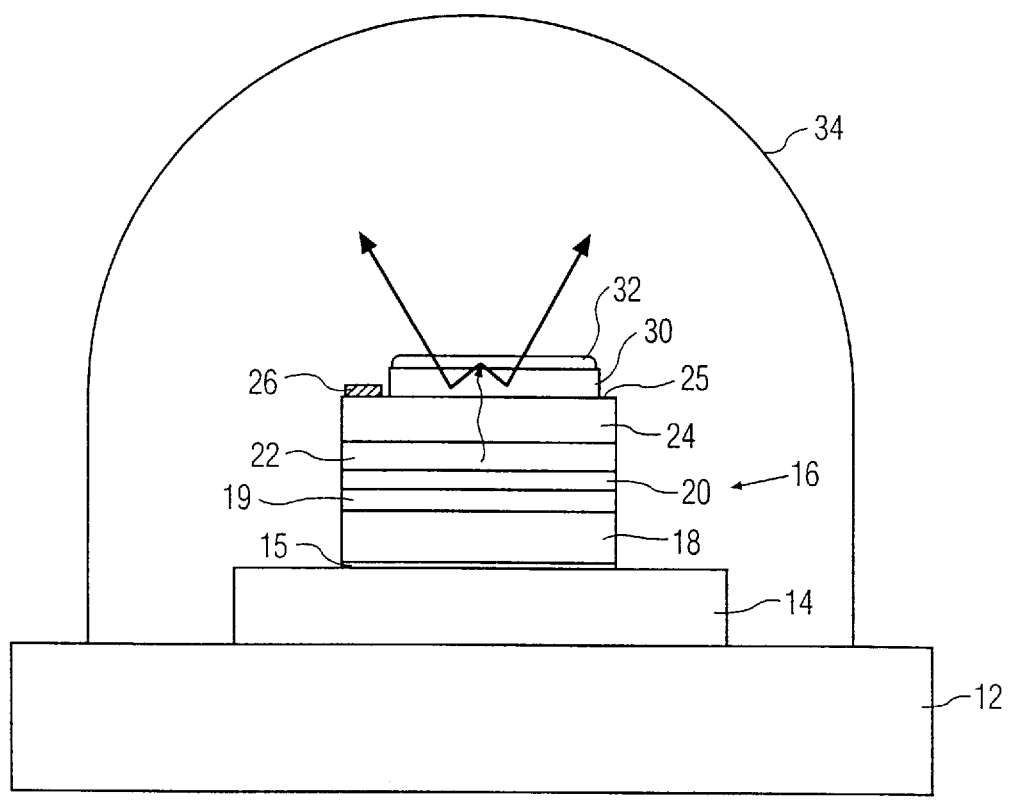
FIG. 1 is a schematic diagram of a visible light emitting device of the invention employing a UV/blue LED, a phosphor layer, and a SWP filter between them.

FIG. 1 shows schematically a first embodiment of a light emitting assembly 10 of the invention, including a substrate 12, a contact layer/heat sink 14, a mirror 15, a UV/blue-emitting LED 16, a SWP filter 30 on the upper surface of the LED, and a UV/blue excitable, visible light-emitting phosphor layer 32 on top of the SWP layer 30. A plastic lens 34 completes the assembly.

The UV/blue LED's employed in the light emitting devices of the invention are similar in structure to those of visible LED's of the prior art, typically based on GaAs and its alloys. However, such UV/blue LED's are based on GaN and its alloys, instead of GaAs and its alloys.

Such devices are multilayer epitaxial structures including at a minimum a lower n type GaN substrate 18, a lower n type wide band gap confining layer 19, an active layer 20, an upper p type wide band gap confining layer 22, a wide band gap injection/window layer 24, and lower and upper ohmic contacts, one of which, contact 26, is shown.

Such LED's may include one or more additional layers, such as guiding layers and buffer layers. In addition, the injection/window layer may itself be a multilayer structure, having a graded band gap.

A more detailed description of such GaN-based LED's may be found in copending U.S. patent application Ser. No. 08/661,528 (Attorney Docket No. PHA 23,132), filed Jun. 11, 1996, the contents of which are incorporated herein by reference.

Between the contact/heat sink layer 14 and the LED 16 is a mirror 15, whose function is to reflect UV/blue light from the active region 20 back toward the upper surface 25 of the LED. Preferably, this mirror is of the type which is able to angularly redistribute the light toward the upper surface, one example of which is the corrugated mirror.

On the upper surface 25 of the LED is a layer of a SWP filter 30, on top of which is a phosphor layer 32. Short wavelength light (UV and or blue) emitted from the active layer 22 of the LED 16, indicated by the wavy arrow in FIG. 1, passes through the filter layer 30 to the phosphor layer 32.

The product of phosphor grain density and grain size should be high enough to ensure that most of the UV and/or blue light from the LED is converted to visible light by the phosphor. Visible light which is emitted in a backward direction from the phosphor layer 32, is reflected by the filter layer 30 in a forward direction, as indicated by the straight arrows, to exit the device.

The preferred SWP filters are multilayer dielectric stacks with alternatingly high and low refractive index and with preferably at least 12 layers, most of these of the so called quarter-wave type. For different devices, projection TV tubes in particular, such SWP filters have been described in Vriens et al. U.S. Pat. Nos. 4,634,926; 4,647,812 and 4,882,617. These filters can be optimized for a one-color (for example red, green or blue) phosphor which emits broad-band or multi-line light, as usual for phosphors, but can also be designed for use with a mixture of phosphor grains emitting different colors, for example, to get a good color rendering.

Plastic lens 34 has a dome-shaped top, and much larger dimensions than those of the LED/phosphor device. This gives a lens-air interface which lies much farther from the region where the visible light is generated and results in much smaller angles of incidence of the light to the normal on the lens-air interface. These smaller angles in turn lead to a much enhanced transmission of the light through this interface and to a more narrow angular distribution of the emitted light.

The UV LED-phosphor device shown in FIG. 1, with or without a dome, can be used alone or together with other such devices. For example, such devices can be arranged in 1- or 2-dimensional arrays. Furthermore, one can also make an LED stack which is much longer in one direction, for example the y-direction (normal to the plane of the Figure) than in the other (the x-) direction. Such an elongated device can be used alone or in an array, for example, in combination with a transparent slab as a UV back light for one of the LCD displays described by Vriens in U.S. Pat. No. 4,822,144.

Such an elongated LED, having for example, a length-to-width ratio of 2 or more, is expected to have a more efficient light extraction and thermal conductivity than an LED of the same area having a ratio near unity.

Figure 2:
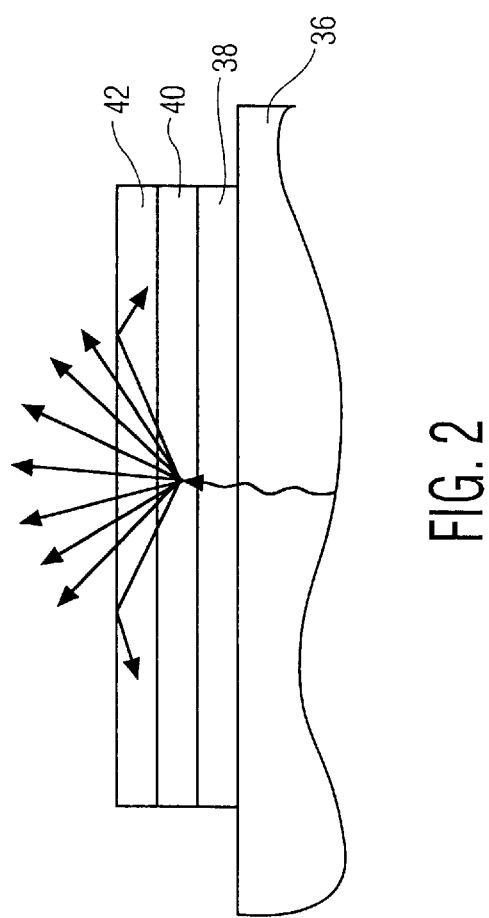
FIG. 2 is a detailed view of an upper portion of a light emitting device of the type shown in FIG. 1, with a SWP filter on top of the phosphor layer in addition to the SWP layer under it.

FIG. 2 shows another embodiment of the LED/phosphor device of the invention. This embodiment is similar to the embodiment shown in FIG. 1, except that in addition to a SWP filter 38 between the LED 36 and the phosphor layer 40, another SWP filter 42 is added on the top (viewing side) of the phosphor layer 40.

This SWP filter 42 has different functions than the SWP filter 38 described in the previous embodiment. The functions of this SWP filter are: (1) to reflect light of too long wavelengths and (2) to reflect part of the light of the wanted wavelengths. Without the filter, this latter light exits into air at both small and large angles to the normal (with the so-called Lambertian or cosine distribution). With the filter, the large-angle light is reflected by the filter and subsequently multiply scattered, angularly redistributed and back-reflected by the phosphor layer 40 and the filter 38 to the filter 42. A significant part of this light can then exit into air at small angles to the normal on the surface. The overall result is a more narrow angular distribution with up to a factor of 2 gain in light intensity in the forward direction, and furthermore a more saturated (i.e. more pure) color. For applications where a more directed beam of light is needed, for example, in optical systems with a relatively small collection angle, this is an advantage. More saturated colors enhance the visibility. For applications such as traffic lights both these advantages may be important. For a different application, projection TV, the functioning of these short-wave pass interference filters in combination with a phosphor layer is explained in detail by Vriens et al. in Philips Technical Review, Vol. 44, No 7, 1989.

Figure 3:
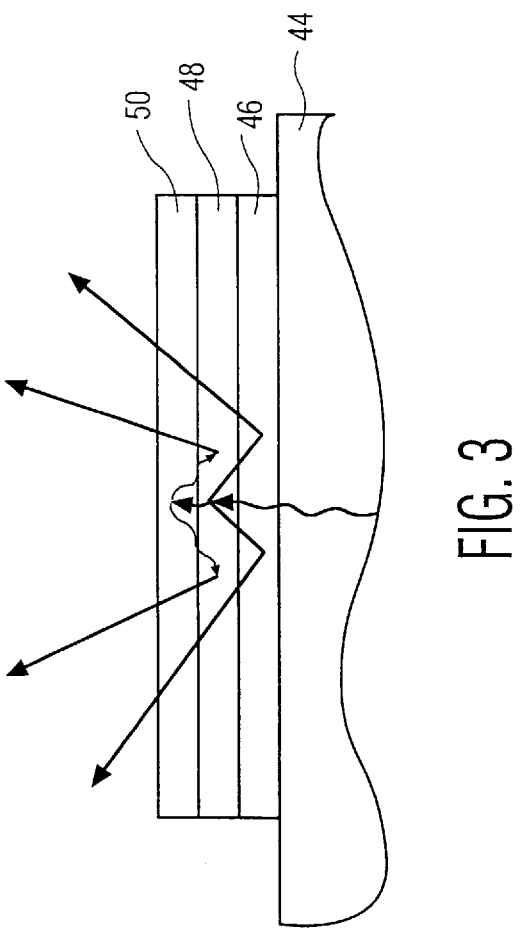
FIG. 3 is a detailed view of an upper portion of a light emitting device of the type shown in FIG. 1, with a LWP filter on top of the phosphor layer in addition to the SWP filter under it.

FIG. 3 shows another embodiment of the present invention. FIG. 3 is the same as FIG. 2, except that a long-wave pass (LWP) filter 50 is positioned on the top of phosphor layer 48.

The preferred LWP filters are multilayer dielectric stacks with alternatingly high and low refractive index, which can be made, for example, by evaporation or sputtering.

The functions of the LWP filter are: (1) to reflect UV light which is not absorbed by the phosphor grains back to the phosphor for another opportunity to be absorbed, and (2) to transmit visible light emitted by the phosphor. Furthermore, the reflection of UV gives a protection for the viewers. The overall result is a more efficient use of both the UV and visible light and a better UV protection.

Figure 4:
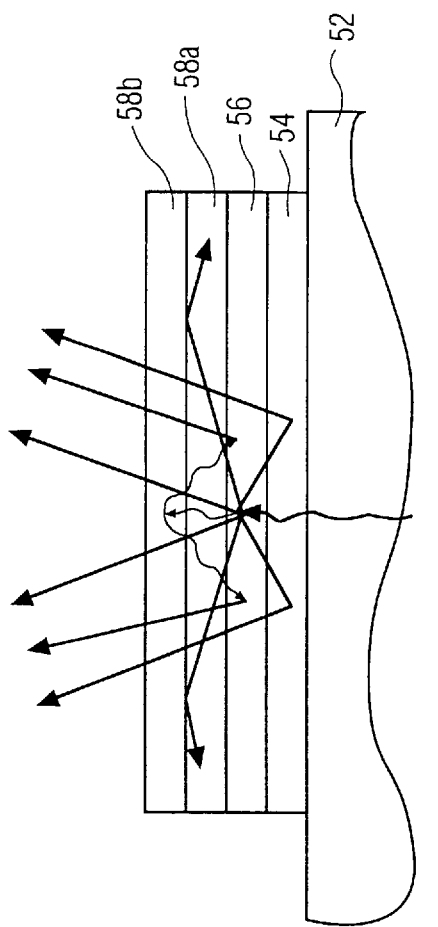
FIG. 4 is a detailed view of an upper portion of a light emitting device of the type shown in FIG. 1, with a BP filter on top of the phosphor layer in addition to the SWP filter under it.

FIG. 4 shows yet another embodiment which combines the advantages of the previous embodiments by using a BP filter 58 on top of the phosphor layer 56, in combination with the SWP filter 54 on the bottom. On the short-wavelength side of the pass band, this BP filter has the characteristics of the LWP filter, ie, it reflects UV and/or blue light and transmits longer wavelength visible light. On the long-wavelength side it has the characteristics of the SWP filter, ie, it reflects visible light of too long wavelengths at all angles and it reflects visible light of shorter wavelengths at large angles. In order to illustrate the separate functions, BP filter 58 is shown in FIG. 4 as two sub-layers 58a and 58b, representing schematically the short-wavelength and long-wavelength sides of the passband, respectively.

In practice, the preferred band pass filters are multilayer dielectric stacks with alternately high and low refractive index, with preferably at least 12 layers, with a slightly different thickness distribution from that of the SWP filter.

It will be appreciated that in order for the various filters described herein to function in the desired manner, they should be formed on a smooth, even surface, and that the graininess of most phosphor layers renders them unsuitable for such purpose. Thus, in such instances, the filter layers on the phosphor layer will be understood to include a transparent substrate, such as a glass sheet. Such glass sheets have the additional advantage that they are UV-absorbing. Preferably, the filter layers are deposited on a glass sheet in reverse order, and the combination can then be placed upside down on the phosphor layer. In the alternative, a substrate for the filters may be provided by embedding the phosphor grains in a matrix having a smooth upper surface, or by forming a single crystal layer of the phosphor composition.

The invention has necessarily been described in terms of a limited number of embodiments and variations thereof. Other embodiments and variations of embodiments will become apparent to those skilled in the art, and are intended to be encompassed within the scope of the appended claims.

What we claim as our invention is:

1. A visible light emitting device comprising: a UV and blue light emitting diode; a layer of a first short wave pass (SWP) filter on the upper surface of the LED; and a layer of a UV and blue excitable, visible light emitting phosphor on upper surface of the SWP filter.

2. The visible light emitting device of claim 1 in which a layer of a second short wave pass (SWP) filter is located on the upper surface of the phosphor layer.

3. The visible light emitting device of claim 1 in which a layer of a long wave pass (LWP) filter is located on the upper surface of the phosphor layer.

4. The visible light emitting device of claim 2 in which a band pass (BP) filter is located on the upper surface of the phosphor layer.

5. The visible light emitting device of claim 1, in which the SWP filter is a multilayer structure of alternately high and low index materials.

6. The visible light emitting device of claim 2, in which the SWP filter is a multilayer structure of alternately high and low index materials.

7. The visible light emitting device of claim 3, in which the LWP filter is a multilayer structure of alternately high and low index materials.

8. The visible light emitting device of claim 4, in which the BP filter is a multilayer structure of alternately high and low index materials.

9. The visible light emitting device of claim 1 in which the device is enclosed in a transparent cover.

10. The visible light emitting device of claim 1 in which the upper surface of the material is dome-shaped.

11. The visible light emitting device of claim 1 in which the LED is elongated in one direction perpendicular to the top surface of the LED.

12. The visible light emitting device of claim 1 in which an angular redistribution mirror is located on the bottom surface of the LED.

* * * * *